United States Patent [19]

Kawada

[11] Patent Number: 5,126,740
[45] Date of Patent: Jun. 30, 1992

[54] DIGITAL-TO-ANALOG CONVERTING UNIT EQUIPPED WITH RESISTOR STRING VARIABLE IN RESISTANCES AT REFERENCE NODES

[75] Inventor: Shigeru Kawada, Tokyo, Japan

[73] Assignee: NEC Corporation, Tokyo, Japan

[21] Appl. No.: 734,235

[22] Filed: Jul. 22, 1991

[30] Foreign Application Priority Data

Jul. 31, 1990 [JP] Japan .................. 2-203312

[51] Int. Cl.$^5$ .................. H03M 1/66
[52] U.S. Cl. .................. 341/144; 341/154
[58] Field of Search .................. 341/144, 145, 146, 147, 341/148, 149, 150, 151, 152, 153, 154, 159, 139

[56] References Cited

U.S. PATENT DOCUMENTS

| 3,918,046 | 11/1975 | Rivers | 341/144 X |
|---|---|---|---|
| 4,091,378 | 5/1978 | Hoffman | 341/159 |
| 4,271,392 | 6/1981 | Outram et al. | 341/139 X |
| 4,468,607 | 8/1984 | Tanaka et al. | 341/144 X |
| 4,837,572 | 6/1989 | Gulczynski | 341/144 X |
| 4,908,623 | 3/1990 | Ullestad | 341/139 X |
| 4,924,225 | 5/1990 | Dingwall et al. | 341/159 X |

Primary Examiner—Sharon D. Logan

[57] ABSTRACT

A digital-to-analog converting unit comprises a series combination of a first resistive element and second resistive elements, a third resistive element selectively coupled to one of both ends of the series combination depending upon a binary value indicated by a digital input signal, and a switching array coupled between reference nodes provided in a series combination of the first to third resistive elements and selectively transferring a voltage level at one of the reference nodes as an analog output signal, and each of the first and third resistive elements provides a half of a resistance produced by one of the second resistive elements so that each of the reference nodes can produce two different voltage levels depending upon connection of the third resistive element, thereby decreasing the number of the component resistive elements.

6 Claims, 4 Drawing Sheets

DIGITAL-TO-ANALOG CONVERTING UNIT EQUIPPED WITH RESISTOR STRING VARIABLE IN RESISTANCES AT REFERENCE NODES

FIELD OF THE INVENTION

This invention relates to a digital-to-analog converting unit and, more particularly, to a digital-to-analog converting unit of the type having a string of resistive elements (which is hereinbelow referred to as "resistor string type digital-to-analog converting unit").

DESCRIPTION OF THE RELATED ART

Various digital-to-analog converting units have been proposed, and resistor string type digital-to-analog converting units and resistive-ladder type digital-to-analog converting units are attractive to integrated circuits. The resistor string type digital-to-analog converting unit is implemented by a series combination of resistive elements, and an output analog voltage signal is taken out through a switching element associated with one of the nodes between two adjacent resistive elements. On the other hand, the resistive-ladder type digital-to-analog converting unit requires two kinds of resistor, i.e. a resistive R element of a unit resistance and a resistive element 2R twice as large as the resistive element R, and the resistive elements R and 2R are fabricated into a ladder-shape. The resistor string type digital-to-analog converting unit is simple in arrangement, and linearity is guaranteed on the analog output signal. Moreover, all the binary number are surely converted into corresponding analog value by the resistor string type digital-to-analog converting unit. These attractive points have found a wide variety of application.

FIG. 1 shows a typical example of the resistor string type 4-bit digital-to-analog converting unit, and comprises four input terminals IN0, IN1, IN2 and IN3 supplied with a four bit digital input signal D0, D1, D2 and D3, a controlling unit 1 coupled to the input terminals IN0 to IN3, a resistor string 2 coupled between first and second reference voltage sources REF1 and REF2, and a switching element array 3 associated with the resistor string 2. The resistor string 2 is implemented by resistive elements R1 to R16 coupled in series, and reference nodes N1 to N16 are provided in the resistor string 2. The switching element array 3 is constituted by switching elements SW1 to SW16 coupled in parallel between the reference nodes N1 to N16 and an output terminal OUT1. Though not shown in FIG. 1, sixteen controlling signal lines CTL1 are coupled in parallel between the controlling unit 1 and the switching elements SW1 to SW16, and the switching elements SW1 to SW16 selectively conduct the associated reference nodes N1 to N16 to the output terminal OUT1. Namely, the controlling unit 1 is implemented by a 4-to-16 decoding circuit, and the digital input signal D0 to D3 is decoded by the controlling unit 1. When the digital input signal D0 to D3 is decoded, the controlling unit 1 shifts one of the sixteen controlling signal lines CTL1 to an active level. The controlling signal line of the active level allows one of the switching elements SW1 to SW16 to turn on or enter a closed-state, and the voltage level at the associated reference node is propagated to the output terminal OUT1. The digital-to-analog converting operation is summarized in Table 1 on the assumption that the digital bits D3 and D0 serve as the most significant bit and the least significant bit, respectively, and "OP" and "CL" stand for "open-state" and "closed-state".

TABLE 1

| INPUT | | | | | | | | | | | | | | | | |
|---|---|---|---|---|---|---|---|---|---|---|---|---|---|---|---|---|
| D3 | 0 | 0 | 0 | 0 | 0 | 0 | 0 | 0 | 1 | 1 | 1 | 1 | 1 | 1 | 1 | 1 |
| D2 | 0 | 0 | 0 | 0 | 1 | 1 | 1 | 1 | 0 | 0 | 0 | 0 | 1 | 1 | 1 | 1 |
| D1 | 0 | 0 | 1 | 1 | 0 | 0 | 1 | 1 | 0 | 0 | 1 | 1 | 0 | 0 | 1 | 1 |
| D0 | 0 | 1 | 0 | 1 | 0 | 1 | 0 | 1 | 0 | 1 | 0 | 1 | 0 | 1 | 0 | 1 |
| SWITING ELEMENT | | | | | | | | | | | | | | | | |
| SW1 | OP | OP | OP | OP | OP | OP | OP | OP | OP | OP | OP | OP | OP | OP | OP | CL |
| SW2 | OP | OP | OP | OP | OP | OP | OP | OP | OP | OP | OP | OP | OP | OP | CL | OP |
| SW3 | OP | OP | OP | OP | OP | OP | OP | OP | OP | OP | OP | OP | OP | CL | OP | OP |
| SW4 | OP | OP | OP | OP | OP | OP | OP | OP | OP | OP | OP | OP | CL | OP | OP | OP |
| SW5 | OP | OP | OP | OP | OP | OP | OP | OP | OP | OP | OP | CL | OP | OP | OP | OP |
| SW6 | OP | OP | OP | OP | OP | OP | OP | OP | OP | OP | CL | OP | OP | OP | OP | OP |
| SW7 | OP | OP | OP | OP | OP | OP | OP | OP | OP | CL | OP | OP | OP | OP | OP | OP |
| SW8 | OP | OP | OP | OP | OP | OP | OP | OP | CL | OP | OP | OP | OP | OP | OP | OP |
| SW9 | OP | OP | OP | OP | OP | OP | OP | CL | OP | OP | OP | OP | OP | OP | OP | OP |
| SW10 | OP | OP | OP | OP | OP | OP | CL | OP | OP | OP | OP | OP | OP | OP | OP | OP |
| SW11 | OP | OP | OP | OP | OP | CL | OP | OP | OP | OP | OP | OP | OP | OP | OP | OP |
| SW12 | OP | OP | OP | OP | CL | OP | OP | OP | OP | OP | OP | OP | OP | OP | OP | OP |
| SW13 | OP | OP | OP | CL | OP | OP | OP | OP | OP | OP | OP | OP | OP | OP | OP | OP |
| SW14 | OP | OP | CL | OP | OP | OP | OP | OP | OP | OP | OP | OP | OP | OP | OP | OP |
| SW15 | OP | CL | OP | OP | OP | OP | OP | OP | OP | OP | OP | OP | OP | OP | OP | OP |
| SW16 | CL | OP | OP | OP | OP | OP | OP | OP | OP | OP | OP | OP | OP | OP | OP | OP |

Relation between the digital input signal D0 to D3 and the analog output signal is shown in Table 2. In Table 2, Vref1 and Vref2 stand for voltage levels at the first and second reference voltage sources REF1 and REF2, and VR is indicative of the difference between the voltage levels Vref1 and Vref2.

TABLE 2

| Digital Input Signal | | | | Analog Output Signal |
|---|---|---|---|---|
| D3 | D2 | D1 | D0 | |
| 0 | 0 | 0 | 0 | (0/16) VR + Vref2 |
| 0 | 0 | 0 | 1 | (1/16) VR + Vref2 |
| 0 | 0 | 1 | 0 | (2/16) VR + Vref2 |
| 0 | 0 | 1 | 1 | (3/16) VR + Vref2 |
| 0 | 1 | 0 | 0 | (4/16) VR + Vref2 |
| 0 | 1 | 0 | 1 | (5/16) VR + Vref2 |
| 0 | 1 | 1 | 0 | (6/16) VR + Vref2 |
| 0 | 1 | 1 | 1 | (7/16) VR + Vref2 |
| 1 | 0 | 0 | 0 | (8/16) VR + Vref2 |
| 1 | 0 | 0 | 1 | (9/16) VR + Vref2 |
| 1 | 0 | 1 | 0 | (10/16) VR + Vref2 |
| 1 | 0 | 1 | 1 | (11/16) VR + Vref2 |
| 1 | 1 | 0 | 0 | (12/16) VR + Vref2 |
| 1 | 1 | 0 | 1 | (13/16) VR + Vref2 |
| 1 | 1 | 1 | 0 | (14/16) VR + Vref2 |
| 1 | 1 | 1 | 1 | (15/16) VR + Vref2 |

A problem is encountered in the prior art resistor string type digital-to-analog converting unit in that a large number of resistive elements are necessary, and the resistive elements are exponentially increased with the component bits of the digital input signal. For example, if the digital input signal consists of 8 bits, the resistor string 2 is constituted by $2^8$ or 256 resistive elements. When the prior art resistor string type digital-to-analog converting unit is integrated on a semiconductor chip, such a large number of resistive elements occupies a substantial amount of real estate on the semiconductor chip, and, accordingly, the semiconductor chip tends to be enlarged.

The integration of such a large number of resistive elements inherently has a difficulty in the fabrication process. Namely, currently available process sequences hardly achieve uniform resistivity over the large resistor string 2 due to fluctuation of process parameters as well as unintentional crystal defects in a resistive region. The accuracy of the digital-to-analog conversion achieved by the string resistor type digital-to-analog converting unit is directly dominated by the uniformity of the resistance of the resistor string 2, and the large resistor string 2 produced through one of the currently available process sequences deteriorates the accuracy of the digital-to-analog conversion.

Yet another drawback inherent in the prior art resistor string type digital-to-analog converting unit is prolonged time period consumed by a testing operation. As described hereinbefore, the uniformity of the resistor string 2 directly affects the accuracy of the digital-to-analog conversion, and the analog output signals are supplied from the reference nodes N1 to N16, respectively. Since the reference node N1 to N16 coupled to the output terminal OUT1 is moved from N1 to N16 together with increment of the binary number represented by the digital input signal. For this reason, in the testing operation, the digital input signal is incremented from zero to the maximum value, and the analog output signal is examined to see whether or not the variation is fallen within an acceptable range. This means that the examination is repeated $2^n$ times for n-bit digital input signal.

SUMMARY OF THE INVENTION

It is therefore an important object of the present invention to provide a digital-to-analog converting unit which is free from the problems inherent in the prior art resistor string type digital-to-analog converting unit.

To accomplish these object, the present invention proposes to selectively coupled a resistive means to one of both ends of a resistor string so as to change voltage levels at reference nodes provided in the resistor string.

In accordance with the present invention, there is provided a digital-to-analog converting unit comprising a) a resistor array having a series combination of a first resistive element and a plurality of second resistive elements, and a third resistive means, each of the first resistive element and the third resistive means providing a half of a resistance produced by one of the plurality of second resistive elements, the series combination having first and second ends opposite to each other, b) a plurality of first switching elements selectively shifted between open and closed states and operative to couple the third resistive means to one of the first and second ends so as to form a resistor string, the plurality of first switching elements being further operative to couple the resistor string between first and second voltage sources different in voltage level from each other, the resistor string having a plurality of reference nodes each provided between two of the first and second resistive elements, the third resistive means and the first and second voltage sources, c) a plurality of second switching elements respectively associated with the reference nodes and selectively shifted between open and closed states for coupling one of the reference nodes to an output node, and d) a controlling unit supplied with a digital input signal and selectively shifting the plurality of first switching elements and the plurality of second switching elements depending upon a binary value indicated by the digital input signal.

The third resistive means may be implemented by a single resistive element, however, another implementation may alternatively use one of two resistive elements physically coupled to the first and second voltage sources.

BRIEF DESCRIPTION OF THE DRAWINGS

The features and advantages of the digital-to-analog converting unit according to the present invention will be more clearly understood from the following description taken in conjunction with the accompanying drawings in which.

DESCRIPTION OF THE PREFERRED EMBODIMENTS

First Embodiment

Figure 2:
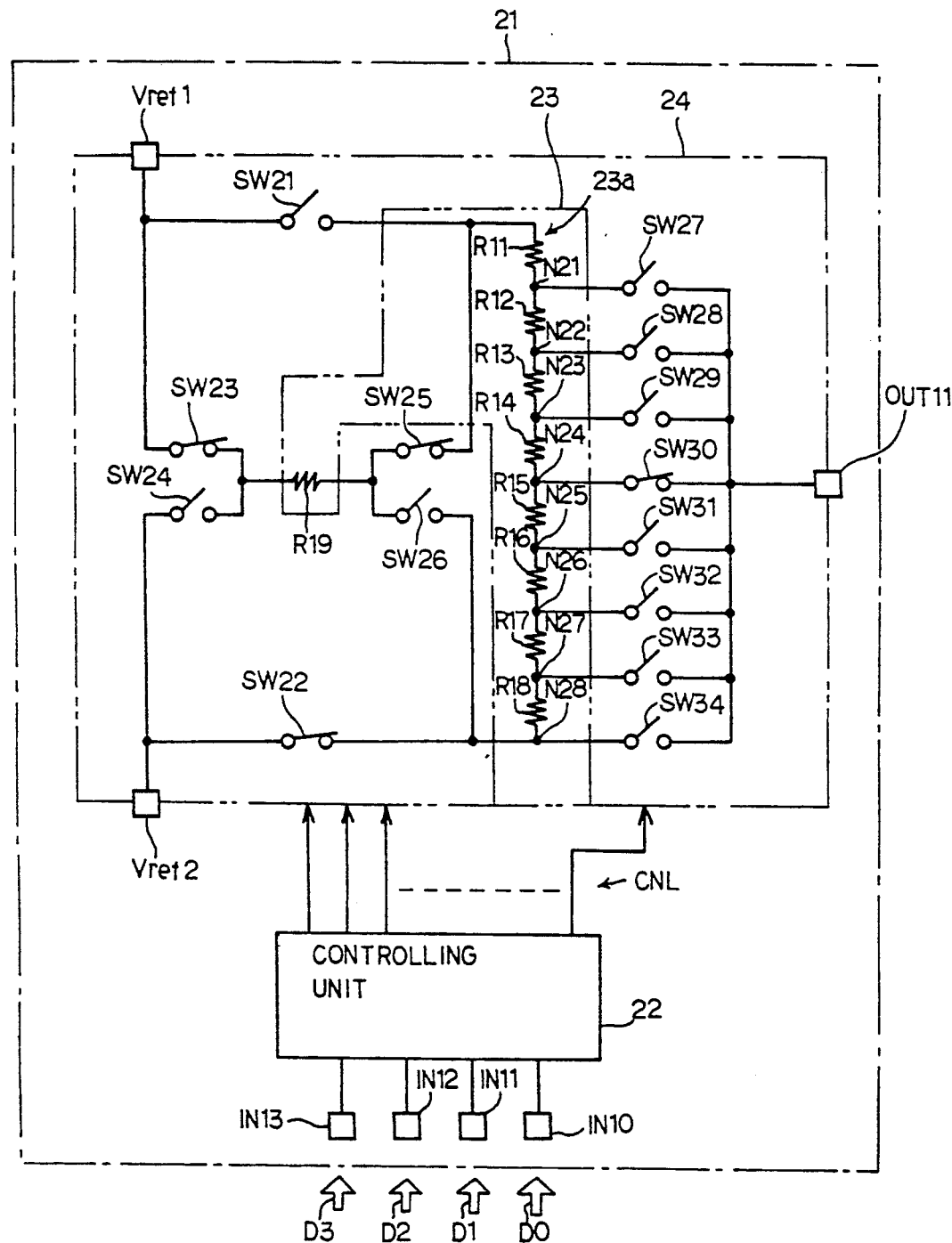
FIG. 2 is a circuit diagram showing the arrangement of a resistor string type digital-to-analog converting unit according to the present invention.

Referring to FIG. 2 of the drawings, a resistor string type digital-to-analog converting unit embodying the present invention is fabricated on a semiconductor substrate 21, and forms a part of a large scale integration. The resistor string type digital-to-analog converting unit largely comprises a controlling unit 22, a resistor array 23 and an analog switching element array 24.

Figure 3:
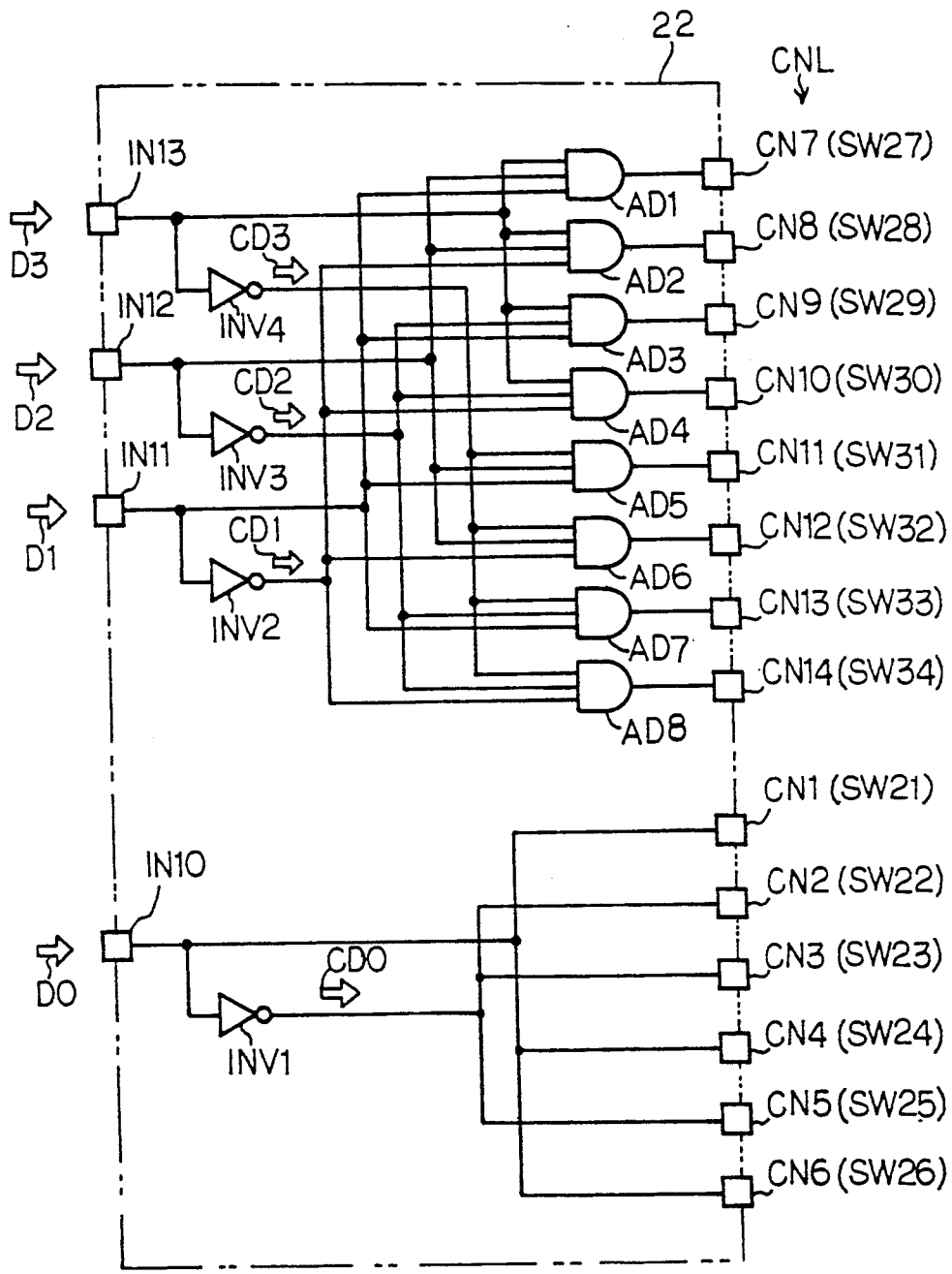
FIG. 3 is a circuit diagram showing the arrangement of a controlling unit incorporated in the resistor string type digital-to-analog converting unit shown in FIG. 2.

The controlling unit 22 is coupled to four input nodes IN10, IN11, IN12 and IN13, and four-bit digital input signal D0, D1, D2 and D3 is supplied to the input nodes IN10 to IN13. The bits D0 and D3 serve as the least significant bit and the most significant bit, respectively. The controlling unit 22 comprises inverting circuits INV1, INV2, INV3 and INV4 for producing the complementary input signal CD0, CD1, CD2 and CD3, and eight AND gates AD1, AD2, AD3, AD4, AD5, AD6, AD7 and AD8 as shown in FIG. 3. Controlling lines CNL are coupled between the controlling unit 22 and the resistor array 23, and is the individual controlling signal lines are labeled with "CN1" to "CN14", respectively. The input node IN10 is directly coupled to the controlling lines CN1, CN4 and CN6, and the inverting circuit INV1 is coupled to the controlling signal line CN2, CN3 and CN5. Therefore, the least significant bit D0 is transferred to the controlling signal lines CN1, CN4 and CN6, and the complementary bit thereof CD0 is supplied to the controlling signal lines CN2, CN3 and CN5. The input nodes IN11 to IN13 and the inverting circuits INV2 to INV4 are selectively coupled to the input nodes of the AND gates AD1 to AD8, and the output nodes of the AND gates AD1 to AD8 are respectively coupled to the controlling signal lines CN7 to CN14.

Turning back to FIG. 2, the resistor array 23 comprises a series combination 23a of a first resistive element R11 and a plurality of second resistive elements R12, R13, R14, R15, R16, R17 and R18, and a third resistive element R19. Each of the second resistive elements R12 to R18 produces a unit resistance R against current, and each of the first and third resistive elements R11 and R19 provides a half of the unit resistance R against current. As will be described hereinbelow, the third resistive element R19 is selectively coupled to one of both ends of the series combination 23a, and the third resistive element R19 and the series combination 23a form in combination a resistor string. Since the resistor string is constituted by seven resistive elements each producing the unit resistance R as well as two resistive elements each producing a half of the unit resistance (R/2), the total resistance of the resistor string is eight times as large as the unit resistance R, or is sixteen times as large as the half unit resistance R/2.

The analog switching element array 24 comprises first analog switching elements SW21, SW22, SW23, SW24, SW25 and SW26 and second analog switching elements SW27, SW28, SW29, SW30, SW31, SW32, SW33 and SW34, and the first and second analog switching elements SW21 to SW34 may be implemented by transistors, respectively. The first analog switching elements SW21 to SW26 are gated by the controlling signal lines CN1 to CN6, respectively, and establish two current paths between first and second reference voltage sources Vref1 and Vref2 and the resistor string.

In detail, when the bit D0 is logic "0" level, the inverting circuit INV1 drives the controlling signal lines CN2, CN3 and CN5 to an active level, and the first analog switching elements SW22, SW23 and SW25 are concurrently shifted to closed state. The other first analog switching elements SW21, SW24 and SW26 are left in open-state. Then, the first analog switching elements SW23 and SW25 provide a current path from the first reference voltage source Vref1 through the third resistive element R19 to the first resistive element R11, and the first analog switching element SW22 couples the second resistive element R18 to the second reference voltage source Vref2.

On the other hand, the bit D0 of logic "1" level shifts the controlling signal lines CN1, CN4 and CN6 to the active level, and the first analog switching elements SW21, SW24 and SW26 establish a current path from the first reference voltage source Vref1 to the first resistive element R11 as well as a current path from the second resistive element R18 through the third resistive element R19 to the second reference voltage source Vref2. However, the other first switching elements SW22, SW23 and SW25 remain in the open state. Thus, the third resistive element R19 is coupled to one of the first resistive element R11 and the second resistive element R18 depending upon the bit D0 of the digital input signal, and allows reference nodes N21 to N28 to vary in voltage level by a half of the unit resistance. In other words, each of the reference nodes N21 to N28 can produce two different voltage levels corresponding to two binary values. In a case where the bit D0 is logic "0" level, voltage levels V21 to V28 at the respective reference nodes N21 to N28 are given as follows.

$V21 = (14/16)VR + Vref2$
$V22 = (12/16)VR + Vref2$
$V23 = (10/16)VR + Vref2$
$V24 = (8/16)VR\ Vref2$
$V25 = (6/16)VR + Vref2$
$V26 = (4/16)VR + Vref2$
$V27 = (2/16)VR + Vref2$
$V28 = (0/16)VR + Vref2$ where VR is the difference in voltage level between the first and second reference voltage sources Vref1 and Vref2. On the contrary, if the bit D0 is logic "1" level, the reference nodes N21 to N28 produces respective voltage levels V21' to V28' which are $V21' = (15/16)\ VR + Vref2$
$V23'' = (11/16)\ VR + Vref2$
$V24'' = (9/16)\ VR + Vref2$
$V25'' = (7/16)\ VR + Vref2$
$V26'' = (5/16)\ VR + Vref2$
$V27'' = (3/16)\ VR + Vref2$
$V28'' = (1/16)\ VR + Vref2$ Thus, each of the reference nodes N21 to N28 produces two different voltage levels such as V21 and V21' depending upon the logic level of the bit D0, and the alternation decreases the number of the component resistive elements R11 to R19. In fact, the prior art resistor string 2 needs $2^4$ or 16 component resistive elements R1 to R16, however, the resistor string according to the present invention is constituted by nine resistive elements R11 to R19, i.e., $(2^{4-1}-1)+2$. This results in reduction of real estate occupied by the resistor array 23.

Figure 1:
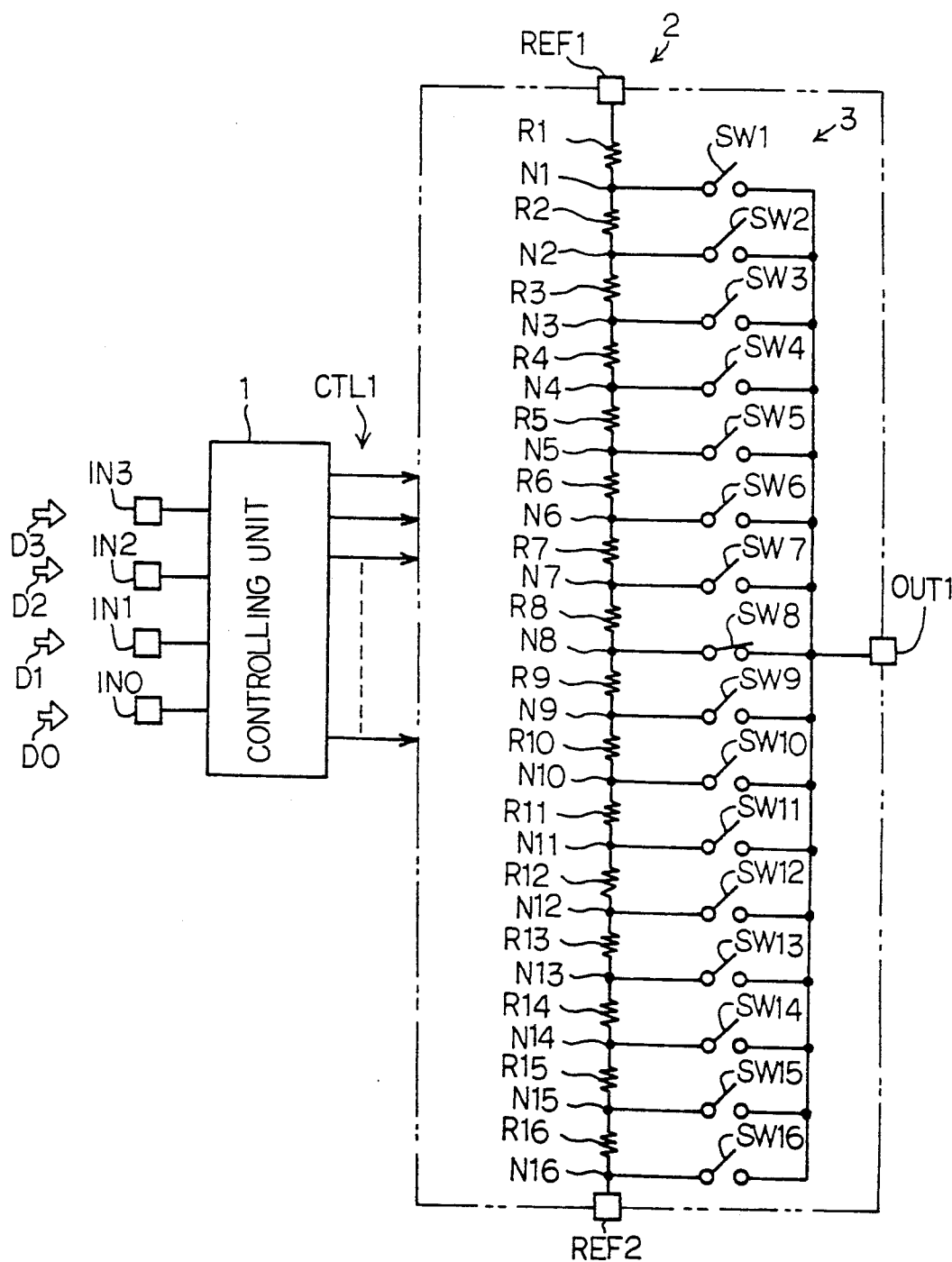
FIG. 1 is a circuit diagram showing the arrangement of the prior art digital-to-analog converting unit.

The second analog switching elements SW27 to SW34 are respectively coupled to the reference nodes N21 to N28, and selectively transfer the voltage levels V21 to V28 and V21' to V28' to an output node OUT11. Namely the second analog switching elements SW27 to SW34 are respectively gated by the controlling signal lines CN7 to CN14, and are selectively shifted between open and closed states. Although the prior art digital-to-analog converting unit shown in FIG. 1 needs sixteen switching elements SW1 to SW16, the digital-to-analog converting unit implementing the first embodiment contains only fourteen analog switching elements SW21 to SW34, and the real estate occupied by the switching element array 24 is decreased. Thus, not only the resistor array 23 but also the switching element array 24 are decreased in size according to the present invention.

Table 3 shows relationship between the bits D1, D2 and D3 of the digital input signal and the states of the first and second analog switching elements SW21 to SW34.

TABLE 3

| INPUT | | | | | | | | | | | | | | | | |
|---|---|---|---|---|---|---|---|---|---|---|---|---|---|---|---|---|
| D3 | 0 | 0 | 0 | 0 | 0 | 0 | 0 | 0 | 1 | 1 | 1 | 1 | 1 | 1 | 1 | 1 |
| D2 | 0 | 0 | 0 | 0 | 1 | 1 | 1 | 1 | 0 | 0 | 0 | 0 | 1 | 1 | 1 | 1 |
| D1 | 0 | 0 | 1 | 1 | 0 | 0 | 1 | 1 | 0 | 0 | 1 | 1 | 0 | 0 | 1 | 1 |
| D0 | 0 | 1 | 0 | 1 | 0 | 1 | 0 | 1 | 0 | 1 | 0 | 1 | 0 | 1 | 0 | 1 |
| SWITING ELEMENT | | | | | | | | | | | | | | | | |

TABLE 3-continued

| | | | | | | | | | | | | | | | | |
|---|---|---|---|---|---|---|---|---|---|---|---|---|---|---|---|---|
| SW27 | OP | OP | OP | OP | OP | OP | OP | OP | OP | OP | OP | OP | OP | OP | CL | CL |
| SW28 | OP | OP | OP | OP | OP | OP | OP | OP | OP | OP | OP | OP | CL | CL | OP | OP |
| SW29 | OP | OP | OP | OP | OP | OP | OP | OP | OP | OP | CL | CL | OP | OP | OP | OP |
| SW30 | OP | OP | OP | OP | OP | OP | OP | OP | CL | CL | OP | OP | OP | OP | OP | OP |
| SW31 | OP | OP | OP | OP | OP | OP | CL | CL | OP | OP | OP | OP | OP | OP | OP | OP |
| SW32 | OP | OP | OP | OP | CL | CL | OP | OP | OP | OP | OP | OP | OP | OP | OP | OP |
| SW33 | OP | OP | CL | CL | OP | OP | OP | OP | OP | OP | OP | OP | OP | OP | OP | OP |
| SW34 | CL | CL | OP | OP | OP | OP | OP | OP | OP | OP | OP | OP | OP | OP | OP | OP |
| SW21 | OP | CL | OP | CL | OP | CL | OP | CL | OP | CL | OP | CL | OP | CL | OP | CL |
| SW22 | CL | OP | CL | OP | CL | OP | CL | OP | CL | OP | CL | OP | CL | OP | CL | OP |
| SW23 | CL | OP | CL | OP | CL | OP | CL | OP | CL | OP | CL | OP | CL | OP | CL | OP |
| SW24 | OP | CL | OP | CL | OP | CL | OP | CL | OP | CL | OP | CL | OP | CL | OP | CL |
| SW25 | CL | OP | CL | OP | CL | OP | CL | OP | CL | OP | CL | OP | CL | OP | CL | OP |
| SW26 | OP | CL | OP | CL | OP | CL | OP | CL | OP | CL | OP | CL | OP | CL | OP | CL |

The relation between the digital input signal D0 to D3 and the analog output signal is summarized in Table 4.

TABLE 4

| Digital Input Signal | | | | |
|---|---|---|---|---|
| D3 | D2 | D1 | D0 | Analog Output Signal |
| 0 | 0 | 0 | 0 | (0/16) VR + Vref2 |
| 0 | 0 | 0 | 1 | (1/16) VR + Vref2 |
| 0 | 0 | 1 | 0 | (2/16) VR + Vref2 |
| 0 | 0 | 1 | 1 | (3/16) VR + Vref2 |
| 0 | 1 | 0 | 0 | (4/16) VR + Vref2 |
| 0 | 1 | 0 | 1 | (5/16) VR + Vref2 |
| 0 | 1 | 1 | 0 | (6/16) VR + Vref2 |
| 0 | 1 | 1 | 1 | (7/16) VR + Vref2 |
| 1 | 0 | 0 | 0 | (8/16) VR + Vref2 |
| 1 | 0 | 0 | 1 | (9/16) VR + Vref2 |
| 1 | 0 | 1 | 0 | (10/16) VR + Vref2 |
| 1 | 0 | 1 | 1 | (11/16) VR + Vref2 |
| 1 | 1 | 0 | 0 | (12/16) VR + Vref2 |
| 1 | 1 | 0 | 1 | (13/16) VR + Vref2 |
| 1 | 1 | 1 | 0 | (14/16) VR + Vref2 |
| 1 | 1 | 1 | 1 | (15/16) VR + Vref2 |

Comparing Table 4 with Table 2, the digital-to-analog converting characteristics are identical with one another. However, the digital-to-analog converting unit according to the present invention has various advantages over the prior art digital-to-analog converting unit. First, since the occupation area of the resistor array 23 is decreased rather than that of the prior art digital-to-analog converting unit, uniformity of the resistance is easily obtained through a currently available fabrication process sequence, and the component resistive elements R11 to R19 are less affectable by crystal defects of the semiconductor substrate 21 As a result, the accuracy of digital-to-analog conversion is surely improved, and the production yield is enhanced in comparison with the prior art digital-to-analog converting unit.

Second, the testing operation is completed within a relatively short time period. The digital input signal D0 to D3 is sequentially incremented from zero to the maximum binary value in the testing operation on the prior art digital-to-analog converting unit. Assuming now that the single examination for a binary value consumes 0.02 second, the prior art digital-to-analog converting unit needs 0.32 second for all of the binary values. However, the resistor string according to the present invention repeats the examination eight times for the reference nodes N21 to N28, and the testing operation is completed within 0.16 second. Thus, the digital-to-analog converting unit according to the present invention allows the diagnostic system to enhance the throughput, and the production cost is decreased in comparison with the prior art digital-to-analog converting unit.

Second Embodiment

Figure 4:
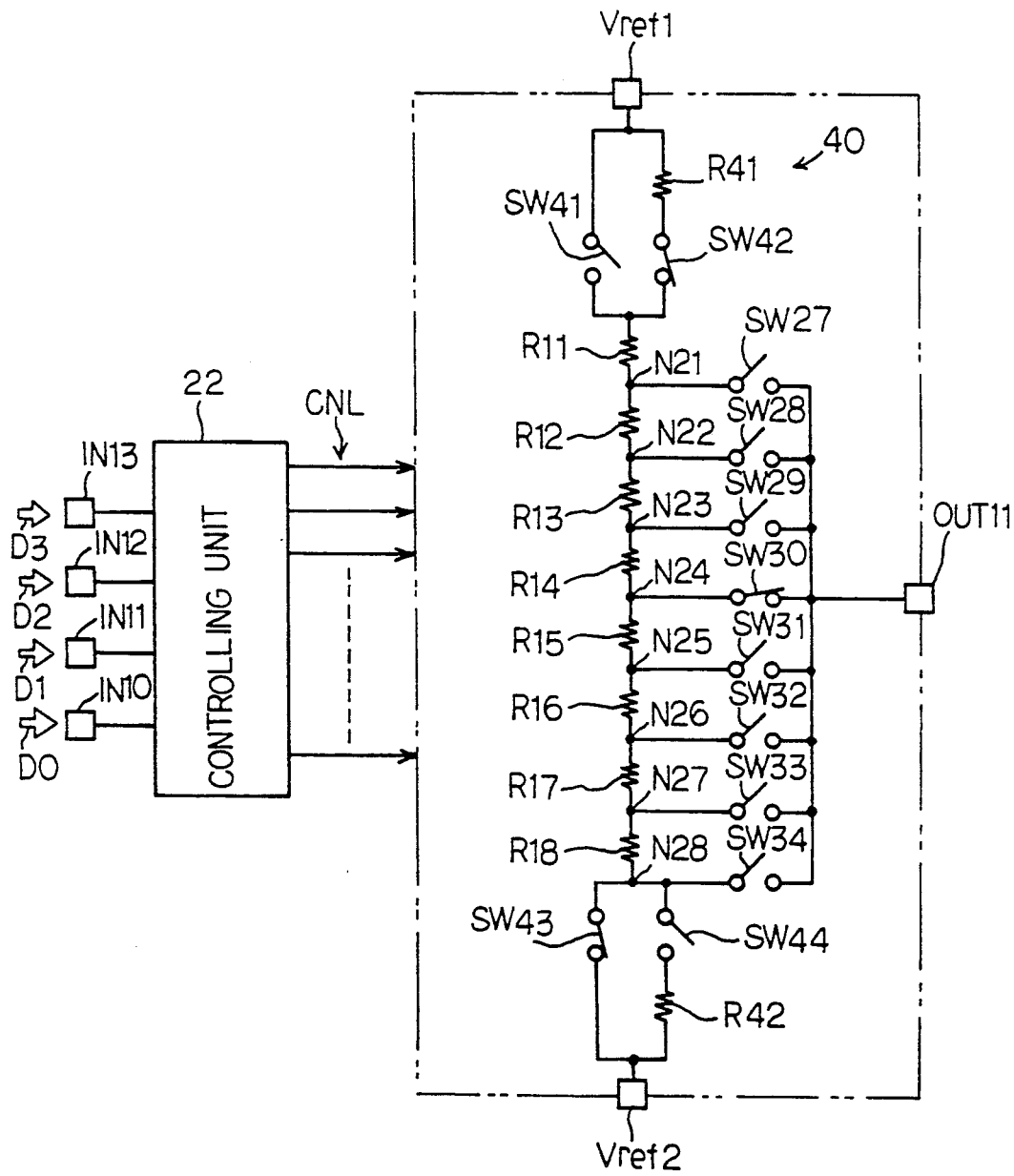
FIG. 4 is a circuit diagram showing the arrangement of another resistor string type digital-to-analog converting unit according to the present invention

Turning to FIG. 4, another digital-to-analog converting unit embodying the present invention is illustrated. The digital-to-analog converting unit shown in FIG. 4 is similar in arrangement to the first embodiment except for a third resistive means 40 and first analog switching elements SW41, SW42, SW43 and SW44. For this reason, the other component elements are designated by the same reference signs as those used in FIG. 2 without any detailed description.

The third resistive means 40 is implemented by two resistive elements R41 and R42 each providing a half of the unit resistance (R/2), and the resistive elements R41 and R42 are coupled to the first and second reference voltage sources Vref1 and Vref2, respectively. The first analog switching elements SW41 and SW42 are provided in association with the first reference voltage sources Vref1. Namely, the first analog switching element SW41 is coupled between the first resistive element R11 and the first reference voltage source Vref1, and the first analog switching element SW42 is coupled between the first resistive element R11 and the resistive element R41. Since the first analog switching elements SW41 and SW42 are alternatively shifted between open and closed states, the first reference voltage source Vref1 is coupled directly to the first resistive element R11 or through the resistive element R41.

Similarly, the first analog switching elements SW43 and SW44 are associated with the second reference voltage source Vref2. The first analog switching element SW43 is coupled between the second resistive element R18 and the second reference voltage source Vref2, and the first analog switching element SW44 is coupled to the second resistive element R18 and the resistive element R42. The first analog switching elements SW43 and SW44 are alternatively shifted between open and closed states, and the second resistive element R18 is coupled to the second reference voltage source Vref2 directly or through the resistive element R42.

When the resistive element R41 is coupled to the first resistive element R11, the first analog switching element SW43 allows the second resistive element R18 to be directly coupled to the second reference voltage source Vref2. On the other hand, while the first analog switching element SW41 directly couples the first reference voltage source Vref1 to the first resistive element R11, the resistive element R42 participates a current path between the second resistive element R18 and the second reference voltage source Vref2. Thus, only one of the resistive elements R41 and R42 forms a part of a current path between the first and second reference voltage sources Vref1 and Vref2, and, for this reason, the third resistive means 40 selectively couples to the first and second resistive elements R11 and R18.

In operation, the controlling unit 22 selectively shifts the first analog switching elements SW41 to SW44 depending upon the logic level of the least significant bit D0, and only one of the second analog switching elements SW27 to SW34 is shifted to the closed state depending upon the component bits D1 to D3 of the digital input signal. Therefore, a voltage level corresponding to the binary value indicated by the digital input signal D0 to D3 is supplied from one of the reference nodes N21 to N28 to the output node OUT11 as similar to the first embodiment.

All of the advantages described hereinbefore are achieved by the digital-to-analog converting unit implementing the second embodiment. The second embodiment is further advantageous in the number of the first analog switching elements SW41 to SW44, and, accordingly, the analog output signal is less affectable by the first analog switching elements SW41 to SW44.

Although particular embodiments of the present invention have been shown and described, it will be obvious to those skilled in the art that various changes and modifications may be made without departing from the spirit and scope of the present invention. For example, a digital-to-analog converting unit according to the present invention may be fabricated on a circuit board with discrete circuit component elements. The first and second embodiments convert 4-bit digital input signals. However, a digital-to-analog converting unit according to the present invention may be used for a digital input signal consisting of more than 4 bits.

What is claimed is:

1. A digital-to-analog converting unit comprising:
   a) a resistor array having a series combination of a first resistive element, a plurality of second resistive elements, and a third resistive means; said first resistive element providing a half of a resistance produced by one of said plurality of second resistive elements; said third resistive means providing a half of a resistance produced by one of said plurality of second resistive elements; said series combination having first and second ends opposite to each other;
   b) a plurality of first switching elements selectively shifted between open and closed states and operative to couple said third resistive means to one of said first and second ends so as to for ma resistor string, said plurality of first switching elements being further operative to couple said resistor string between first and second voltage sources different in voltage level from each other, said resistor string having a plurality of reference nodes provided between said first and one of said second resistive elements and between adjacent ones of said second resistive elements or at one of said first and second ends;
   c) a plurality of second switching elements respectively associated with said reference nodes and selectively shifted between open and closed states for coupling at least one of said reference nodes to an output node; and
   d) a controlling unit supplied with a digital input signal for selectively shifting said plurality of first switching elements and said plurality of second switching elements depending upon a binary value indicated by said digital input signal.

2. A digital-to-analog converting unit as set forth in claim 1, in which said third resistive means is formed by a single resistive element, and in which said first switching elements selectively couple the single resistive element between said first voltage source and said first end and between said second end and said second voltage source, one of said first switching elements coupling said second end to said second voltage source while said single resistive element is coupled between said first voltage source and said first end, another of said first switching elements alternatively coupling said first voltage source to said first end while said single resistive element is coupled between said second end and said second voltage source.

3. A digital-to-analog converting unit as set forth in claim 2, in which said digital input signal has a least significant bit and said controlling unit controls said first switching elements according to the least significant bit of said digital input signal.

4. A digital-to-analog converting unit as set forth in claim 3, in which said digital-to-analog converting unit is fabricated on a single semiconductor chip.

5. A digital-to-analog converting unit as set forth in claim 1, in which said third resistive means is implemented by two resistive elements coupled to said first and second voltage sources, respectively, each of said two resistive elements providing a half of said resistance, and in which said first analog switching elements alternatively provides a current path from said first voltage source through one of said two resistive elements coupled to said first voltage source and said series combination to said second voltage source and a current path from said first voltage source through said series combination and another of said two resistive elements coupled to said second voltage source.

6. A digital-to-analog converting unit as set forth in claim 5, in which said digital input signal has a least significant bit and said controlling unit controls said first switching elements according to of the least significant bit of said digital input signal.

* * * * *